（12）United States Patent
Tsukuda

(10) Patent No.: US 12,205,964 B2
(45) Date of Patent: Jan. 21, 2025

(54) LIGHT RECEIVING DEVICE AND DISTANCE MEASUREMENT SYSTEM

(71) Applicant: SONY SEMICONDUCTOR SOLUTIONS CORPORATION, Kanagawa (JP)

(72) Inventor: Yasunori Tsukuda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 587 days.

(21) Appl. No.: 17/310,150

(22) PCT Filed: Jan. 16, 2020

(86) PCT No.: PCT/JP2020/001165
§ 371 (c)(1),
(2) Date: Jul. 21, 2021

(87) PCT Pub. No.: WO2020/158401
PCT Pub. Date: Aug. 6, 2020

(65) Prior Publication Data
US 2022/0052083 A1   Feb. 17, 2022

(30) Foreign Application Priority Data

Jan. 30, 2019   (JP) .................................. 2019-013776

(51) Int. Cl.
*H01L 31/02*    (2006.01)
*G01S 7/481*    (2006.01)
(Continued)

(52) U.S. Cl.
CPC ........ *H01L 27/1446* (2013.01); *G01S 7/4816* (2013.01); *H01L 27/1443* (2013.01);
(Continued)

(58) Field of Classification Search
CPC ........ G01S 17/86; G01S 17/89; G01S 17/894; G01S 17/93; G01S 17/931; G01S 7/4808;
(Continued)

(56) References Cited

U.S. PATENT DOCUMENTS 11,378,659 B2 *   7/2022   Isogai ............... H01L 27/14623
11,652,175 B2 *   5/2023   Murase ............. H01L 31/02019
                                                                    257/431
(Continued)

FOREIGN PATENT DOCUMENTS

CN     106254729 A     12/2016
CN     108931818 A     12/2018
(Continued)

OTHER PUBLICATIONS

International Search Report and Written Opinion of PCT Application No. PCT/JP2020/001165, issued on Mar. 17, 2020, 11 pages of ISRWO.
(Continued)

*Primary Examiner* — John R Lee
(74) *Attorney, Agent, or Firm* — CHIP LAW GROUP

(57) ABSTRACT

The present technology relates to a light receiving device and a distance measurement system that enable light to be surely received by a reference pixel. A light receiving device includes a plurality of pixels each including a light receiving element having a light receiving surface, and a light emission source provided on an opposite side of the light receiving surface with respect to the light receiving element. The plurality of pixels includes a first pixel including a light shielding member provided between the light receiving element and the light emission source, and a second pixel including a light guiding unit that is configured to propagate a photon and is provided between the light receiving element and the light emission source. The present technology can be
(Continued)

applied to a distance measurement system or the like that detects a distance to a subject in a depth direction, for example, for example.

17 Claims, 11 Drawing Sheets

(51) Int. Cl.
  *H01L 27/144* (2006.01)
  *H01L 27/146* (2006.01)
  *H01L 31/0216* (2014.01)
  *H01L 31/12* (2006.01)
  *G01S 17/89* (2020.01)

(52) U.S. Cl.
  CPC ...... *H01L 31/02164* (2013.01); *H01L 31/125* (2013.01); *G01S 17/89* (2013.01)

(58) Field of Classification Search
  CPC ...... G01S 7/481; G01S 7/4816; G01S 7/4817; G01S 7/483; G01S 7/486; G01S 7/4861; G01S 7/4863; H01L 27/14; H01L 27/144; H01L 27/1443; H01L 27/1446; H01L 27/146; H01L 27/14601; H01L 27/14609; H01L 27/1461; H01L 27/14612; H01L 31/02162; H01L 31/02164; H01L 31/125; H04N 25/44; H04N 25/441; H04N 25/47; H04N 25/50; H04N 25/53
  See application file for complete search history.

(56) References Cited

U.S. PATENT DOCUMENTS

| | | |
|---|---|---|
| 2004/0165102 A1 | 8/2004 | Komatsu et al. |
| 2005/0195318 A1 | 9/2005 | Komatsu et al. |
| 2008/0029837 A1 | 2/2008 | Kameda et al. |
| 2009/0079345 A1 | 3/2009 | Inuiya |
| 2013/0313673 A1 | 11/2013 | Kameda et al. |
| 2016/0358329 A1 | 12/2016 | Koide |
| 2018/0038945 A1 | 2/2018 | Zhuang et al. |
| 2019/0252442 A1 | 8/2019 | Tanaka et al. |
| 2019/0259902 A1 | 8/2019 | Shimizu |
| 2022/0052083 A1* | 2/2022 | Tsukuda ................ H01L 31/107 |
| 2022/0171032 A1* | 6/2022 | Watanabe ............. G01S 7/4863 |
| 2022/0223632 A1* | 7/2022 | Watanabe ......... H01L 27/14636 |
| 2023/0071795 A1* | 3/2023 | Watanabe ............. G01S 17/931 |

FOREIGN PATENT DOCUMENTS

| | | |
|---|---|---|
| CN | 109196662 A | 1/2019 |
| CN | 109643722 A | 4/2019 |
| EP | 3290950 A1 | 3/2018 |
| EP | 3549169 A1 | 10/2019 |
| JP | 2004-260798 A | 9/2004 |
| JP | 2008-041776 A | 2/2008 |
| JP | 2009-081298 A | 4/2009 |
| JP | 2010-286448 A | 12/2010 |
| JP | 2014-081254 A | 5/2014 |
| JP | 2017-005423 A | 1/2017 |
| JP | 2018-088488 A | 6/2018 |
| KR | 10-2008-0012166 A | 2/2008 |
| KR | 10-2017-0053570 A | 5/2017 |
| KR | 10-2018-0086895 A | 8/2018 |
| WO | 2017/209206 A1 | 12/2017 |
| WO | 2018/101033 A1 | 6/2018 |

OTHER PUBLICATIONS

Office Action for KR Patent Application No. 10-2021-7022954, issued on Oct. 7, 2024, 5 pages of English Translation and 6 pages of Office Action.

* cited by examiner

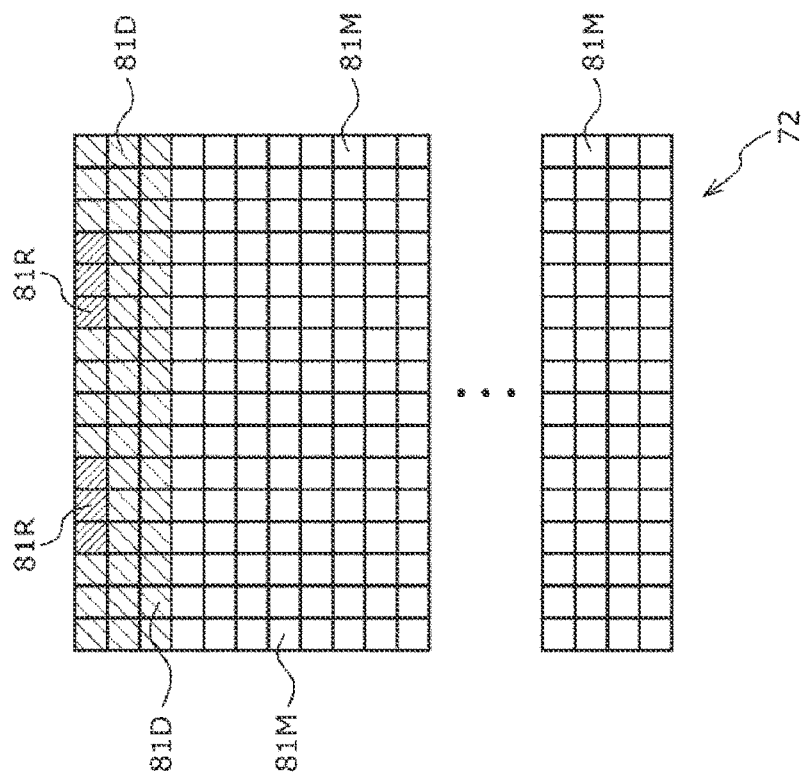
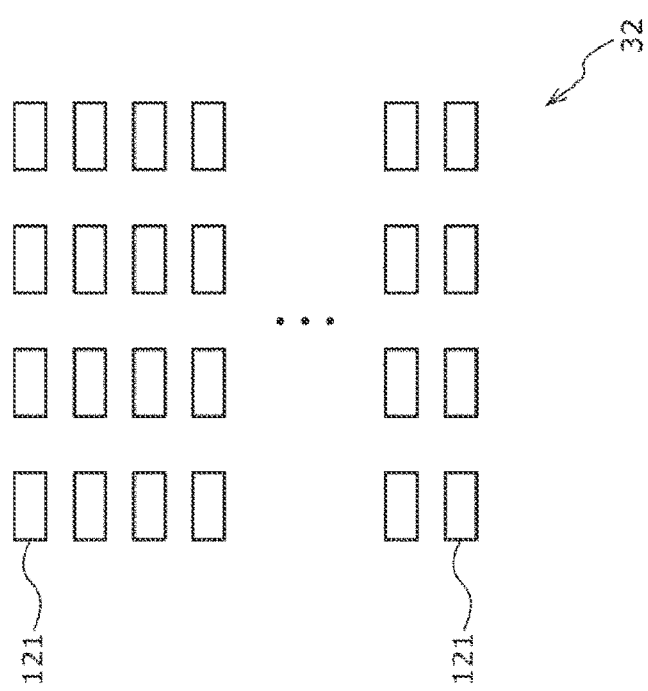

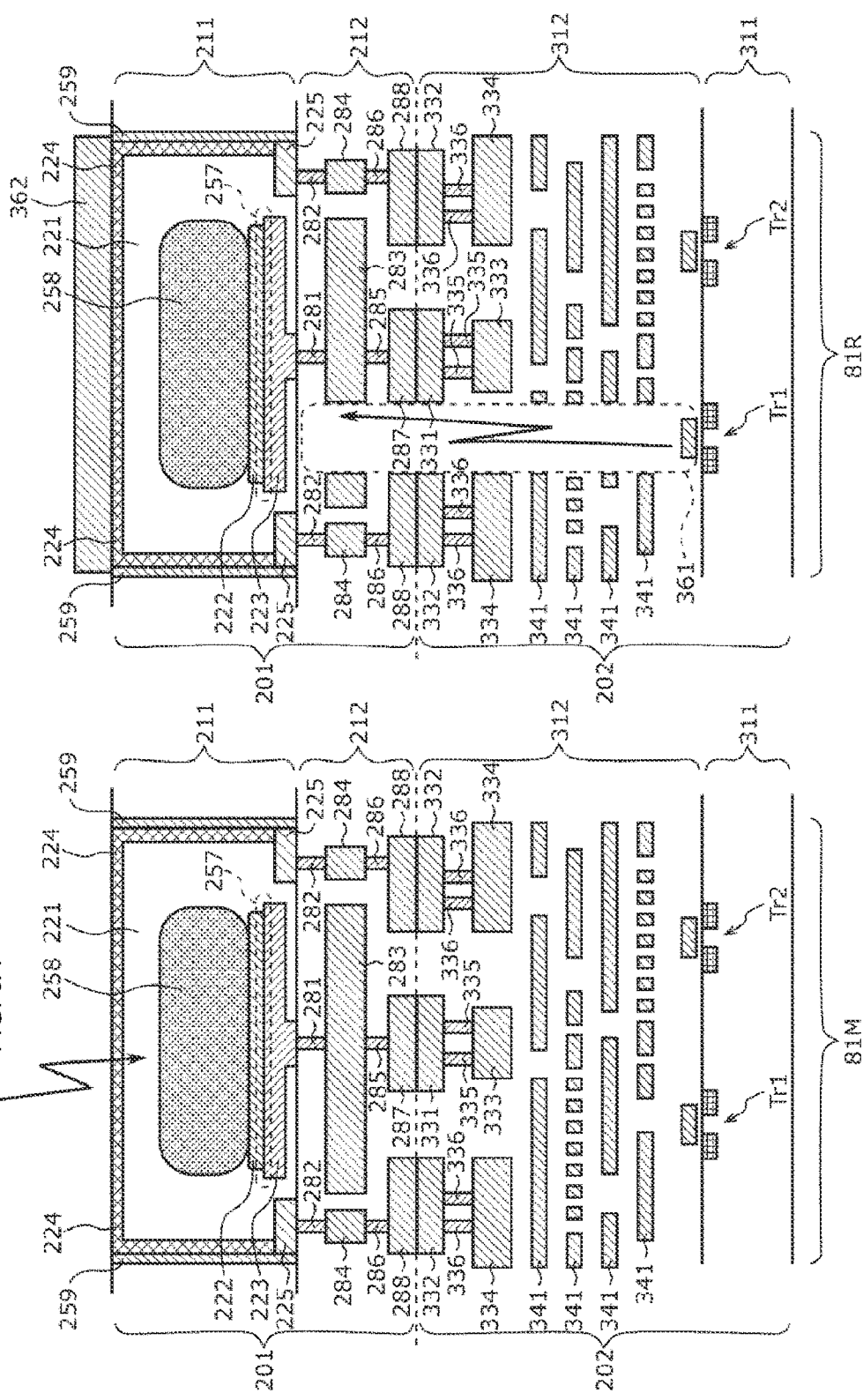

LIGHT RECEIVING DEVICE AND DISTANCE MEASUREMENT SYSTEM

CROSS REFERENCE TO RELATED APPLICATIONS

This application is a U.S. National Phase of International Patent Application No. PCT/JP2020/001165 filed on Jan. 16, 2020, which claims priority benefit of Japanese Patent Application No. JP 2019-013776 filed in the Japan Patent Office on Jan. 30, 2019. Each of the above-referenced applications is hereby incorporated herein by reference in its entirety.

TECHNICAL FIELD

The present technology relates to a light receiving device and a distance measurement system, and relates particularly to a light receiving device and a distance measurement system that enable light to be surely received by a reference pixel.

BACKGROUND ART

In recent years, distance measurement sensors that perform distance measurement using a Time-of-Flight (ToF) method have attracted attention. Some of such distance measurement sensors use a single photon avalanche diode (SPAD) as a pixel, for example. In the SPAD, if one photon enters a high-field PN junction region in a state in which a voltage larger than a breakdown voltage is applied, avalanche amplification occurs. By detecting a timing at which current instantaneously flows at the time, it is possible to accurately measure a distance.

For example, Patent Document 1 discloses a technology of providing measurement pixels and reference pixels in a distance measurement sensor that uses the SPAD, measuring background light intensity by the reference pixels, and changing a bias voltage of the SPAD.

CITATION LIST

Patent Document

Patent Document 1: Japanese Patent Application Laid-Open No. 2014-81254

SUMMARY OF THE INVENTION

Problems to be Solved by the Invention

However, in the technology of Patent Document 1, because background light is used as light to be detected by the reference pixels, uncertainty has remained.

The present technology has been devised in view of such situations, and enables light to be surely received by a reference pixel.

Solutions to Problems

A light receiving device according to the first aspect of the present technology includes a plurality of pixels each including a light receiving element having a light receiving surface, and a light emission source provided on an opposite side of the light receiving surface with respect to the light receiving element, in which the plurality of pixels includes a first pixel including a light shielding member provided between the light receiving element and the light emission source, and a second pixel including a light guiding unit that is configured to propagate a photon and is provided between the light receiving element and the light emission source.

A distance measurement system according to the second aspect of the present technology includes an illumination device configured to emit illumination light, and a light receiving device configured to receive reflected light of the illumination light, in which the light receiving device include a plurality of pixels each including a light receiving element having a light receiving surface, and a light emission source provided on an opposite side of the light receiving surface with respect to the light receiving element, and the plurality of pixels includes a first pixel including a light shielding member provided between the light receiving element and the light emission source, and a second pixel including a light guiding unit that is configured to propagate a photon and is provided between the light receiving element and the light emission source.

In the first to third aspects of the present technology, a plurality of pixels each including a light receiving element having a light receiving surface, and a light emission source provided on an opposite side of the light receiving surface with respect to the light receiving element is provided. The plurality of pixels includes a first pixel including a light shielding member provided between the light receiving element and the light emission source, and a second pixel including a light guiding unit that is configured to propagate a photon and is provided between the light receiving element and the light emission source.

The light receiving device and the distance measurement system may be independent devices, or may be modules incorporated in other devices.

BRIEF DESCRIPTION OF DRAWINGS

FIGS. 5A and 5B are plan views of a light source and a pixel array.

FIGS. 6A and 6B are cross-sectional views of a pixel.

MODE FOR CARRYING OUT THE INVENTION

Hereinafter, a mode for carrying out the present technology (hereinafter, referred to as an embodiment) will be described. Note that the description will be given in the following order.

1. Configuration Example of Distance Measurement System
2. Configuration Example of Light Receiving Device
3. Configuration Example of Pixel Circuit
4. Plan View of Light Source and Pixel Array
5. Pixel Cross-Sectional View
6. Comparative Example
7. Another Array Example of Pixels
8. Usage Example of Distance Measurement System
9. Application Example to Movable Body

1. Configuration Example of Distance Measurement System

Figure 1:
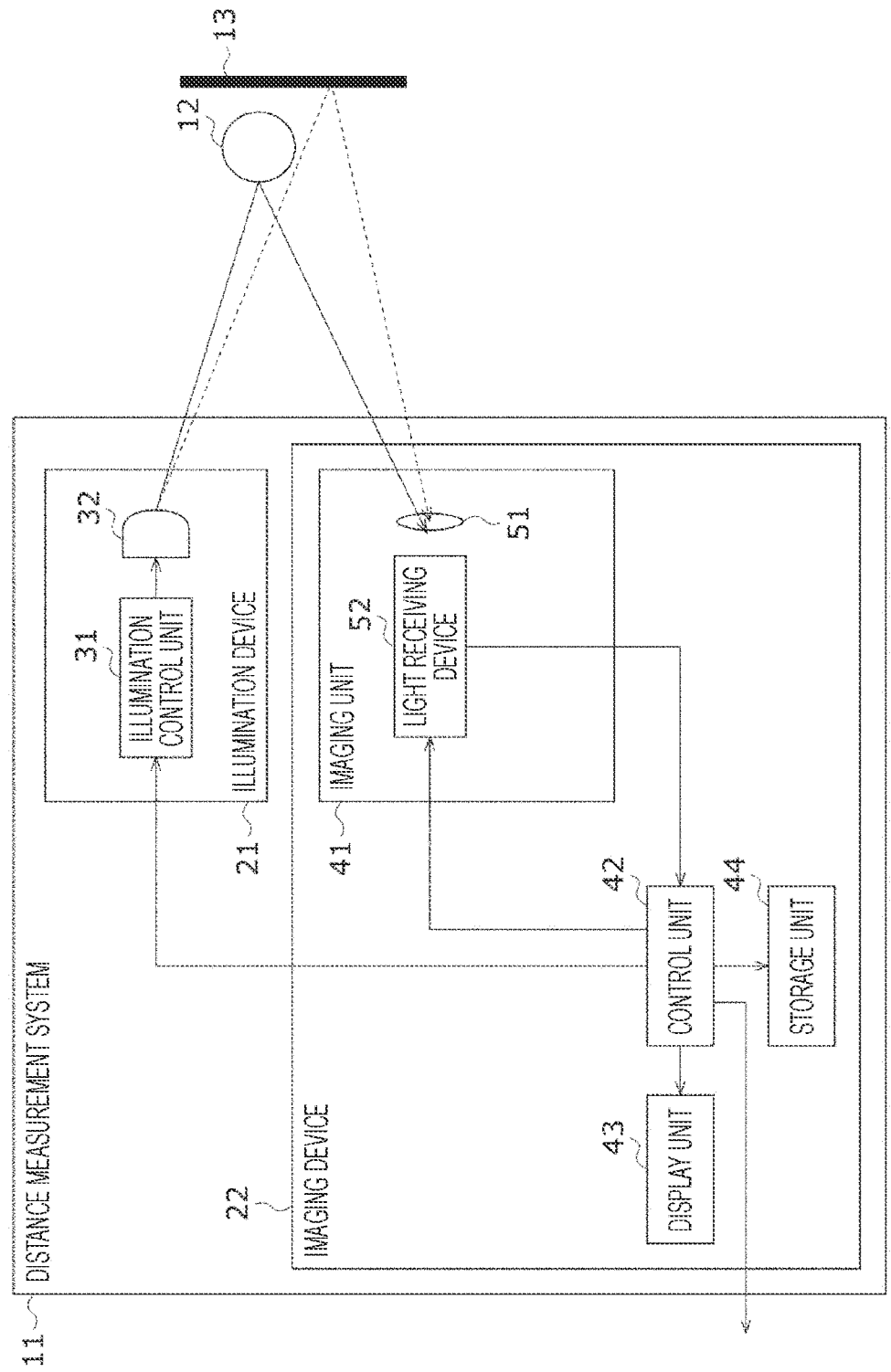
FIG. 1 is a block diagram illustrating a configuration example of an embodiment of a distance measurement system to which the present technology is applied.

FIG. 1 is a block diagram illustrating a configuration example of an embodiment of a distance measurement system to which the present technology is applied.

A distance measurement system 11 is a system that captures a distance image using a ToF method, for example. Here, the distance image is an image obtained by detecting a distance in a depth direction from the distance measurement system 11 to a subject for each pixel. A signal of each pixel includes a distance pixel signal that is based on the detected distance.

The distance measurement system 11 includes an illumination device 21 and an imaging device 22.

The illumination device 21 includes an illumination control unit 31 and a light source 32.

Under the control of a control unit 42 of the imaging device 22, the illumination control unit 31 controls a pattern in which the light source 32 emits light. Specifically, in accordance with an emission code included in an emission signal supplied from the control unit 42, the illumination control unit 31 controls a pattern in which the light source 32 emits light. For example, the emission code includes two values corresponding to 1 (High) and 0 (Low). When the value of the emission code is 1, the illumination control unit 31 turns on the light source 32, and when the value of the emission code is 0, the illumination control unit 31 turns off the light source 32.

Under the control of the illumination control unit 31, the light source 32 emits light in a predetermined wavelength band. The light source 32 includes an infrared laser diode, for example. Note that the type of the light source 32 and the wavelength band of illumination light can be arbitrarily set in accordance with a use application or the like of the distance measurement system 11.

The imaging device 22 is a device that receives reflected light of light (illumination light) that has been emitted from the illumination device 21 and reflected by a subject 12, a subject 13, and the like. The imaging device 22 includes an imaging unit 41, the control unit 42, a display unit 43, and a storage unit 44.

The imaging unit 41 includes a lens 51 and a light receiving device 52.

The lens 51 forms an image of incident light on a light receiving surface of the light receiving device 52. Note that a configuration of the lens 51 is an arbitrary, and the lens 51 may include a plurality of lens units, for example.

The light receiving device 52 includes a sensor that uses a single photon avalanche diode (SPAD) as each pixel, for example. Under the control of the control unit 42, the light receiving device 52 receives reflected light from the subject 12, the subject 13, and the like, converts a resultant pixel signal into distance information, and outputs the distance information to the control unit 42. The light receiving device 52 supplies, to the control unit 42 as a pixel value (distance pixel signal) of each pixel of a pixel array in which pixels are two-dimensionally arrayed in a matrix in a row direction and a column direction, a distance image storing a digital count value obtained by counting a time from when the illumination device 21 emits illumination light to when the light receiving device 52 receives the light. A light emission timing signal indicating a timing at which the light source 32 emits light is supplied also to the light receiving device 52 from the control unit 42.

Note that, by the distance measurement system 11 repeating light emission of the light source 32 and reception of the reflected light a plurality of times (for example, several thousands to several tens of thousands of times), the imaging unit 41 generates a distance image from which influence of ambient light, multipath, or the like has been removed, and supplies the distance image to the control unit 42.

The control unit 42 includes, for example, a control circuit or a processor such as a field programmable gate array (FPGA) or a digital signal processor (DSP), and the like. The control unit 42 performs control of the illumination control unit 31 and the light receiving device 52. Specifically, the control unit 42 supplies an emission signal to the illumination control unit 31, and supplies a light emission timing signal to the light receiving device 52. The light source 32 emits illumination light in accordance with the emission signal. The light emission timing signal may be an emission signal supplied to the illumination control unit 31. Furthermore, the control unit 42 supplies the distance image acquired from the imaging unit 41, to the display unit 43, and causes the display unit 43 to display the distance image. Moreover, the control unit 42 causes the storage unit 44 to store the distance image acquired from the imaging unit 41. Furthermore, the control unit 42 outputs the distance image acquired from the imaging unit 41, to the outside.

The display unit 43 includes a panel-shaped display device such as a liquid crystal display device or an organic Electro Luminescence (EL) display device, for example.

The storage unit 44 can include an arbitrary storage device or storage medium, or the like, and stores a distance image or the like.

2. Configuration Example of Light Receiving Device

Figure 2:
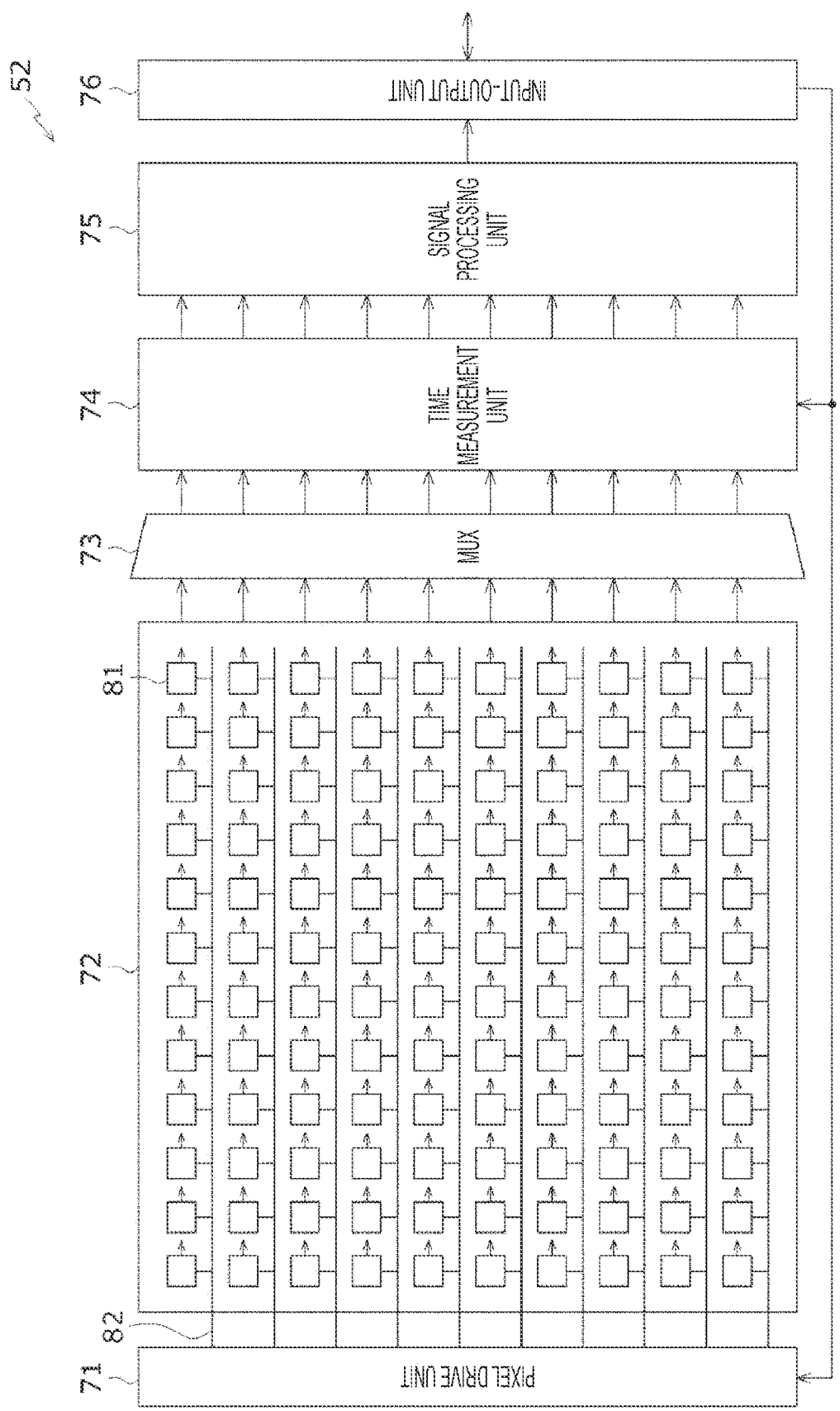
FIG. 2 is a block diagram illustrating a configuration example of a light receiving device in FIG. 1.

FIG. 2 is a block diagram illustrating a configuration example of the light receiving device 52.

The light receiving device 52 includes a pixel drive unit 71, a pixel array 72, a multiplexer (MUX) 73, a time measurement unit 74, a signal processing unit 75, and an input-output unit 76.

The pixel array 72 has a configuration in which pixels 81 are two-dimensionally arrayed in a matrix in the row direction and the column direction. Each of the pixels 81 detects the entry of a photon, and outputs a detection signal indicating a detection result, as a pixel signal. Here, the row direction refers to an array direction of the pixels 81 in a horizontal direction, and the column direction refers to an array direction of the pixels 81 in a vertical direction. Due to limitations of space, a pixel array configuration of the pixel array 72 that is illustrated in FIG. 2 includes ten rows and twelve columns, but the number of rows and the number of columns of the pixel array 72 are not limited to these, and can be arbitrary set.

For each pixel row, a pixel drive line 82 is wired in the horizontal direction to the matrix pixel array of the pixel array 72. The pixel drive line 82 transmits a drive signal for driving the pixels 81. The pixel drive unit 71 drives each of the pixels 81 by supplying a predetermined drive signal to each of the pixels 81 via the pixel drive lines 82. Specifically, the pixel drive unit 71 performs control in such a manner as to set at least a part of the plurality of pixels 81 two-dimensionally arrayed in a matrix, as active pixels, and set the remaining pixels 81 as inactive pixels, at a predetermined timing synchronized with a light emission timing signal supplied from the outside via the input-output unit 76. The active pixel is a pixel that detects the entry of a photon, and the inactive pixel is a pixel that does not detect the entry of a photon. As a matter of course, all of the pixels 81 of the pixel array 72 may be set as active pixels The detailed configuration of the pixels 81 will be described later.

Note that FIG. 2 illustrates the pixel drive line 82 as one wire, but the pixel drive line 82 may include a plurality of wires. One end of the pixel drive line 82 is connected to an output end of the pixel drive unit 71 that corresponds to each pixel row.

The MUX 73 selects an output from the active pixels in accordance with switching between active pixels and inactive pixels in the pixel array 72. Then, the MUX 73 outputs pixel signals input from the selected active pixels, to the time measurement unit 74.

On the basis of pixel signals of active pixels that are supplied from the MUX 73, and a light emission timing signal indicating a light emission timing of the light source 32, the time measurement unit 74 generates a count value corresponding to a time from when the light source 32 emits light to when active pixels receive the light. The time measurement unit 74 is also referred to as a time to digital converter (TDC). The light emission timing signal is supplied from the outside (the control unit 42 of the imaging device 22) via the input-output unit 76.

On the basis of the light emission of the light source 32 and the reception of the reflected light that are repeatedly executed a predetermined times (for example, several thousands to several tens of thousands of times), the signal processing unit 75 creates a histogram indicating a time (count value) until reception of reflected light, for each pixel. Then, by detecting a peak of the histogram, the signal processing unit 75 determines a time until light emitted from the light source 32 returns by being reflected on the subject 12 or the subject 13. The signal processing unit 75 generates a distance image storing a digital count value obtained by counting a time until the light receiving device 52 receives light, in each pixel, and supplies the distance image to the input-output unit 76. Alternatively, furthermore, the signal processing unit 75 may perform calculation for obtaining a distance to an object on the basis of the determined time and a light speed, generate a distance image storing the calculation result in each pixel, and supply the distance image to the input-output unit 76.

The input-output unit 76 outputs a signal (distance image signal) of the distance image that is supplied from the signal processing unit 75, to the outside (the control unit 42). Furthermore, the input-output unit 76 acquires a light emission timing signal supplied from the control unit 42, and supplies the light emission timing signal to the pixel drive unit 71 and the time measurement unit 74.

3. Configuration Example of Pixel Circuit

Figure 3:
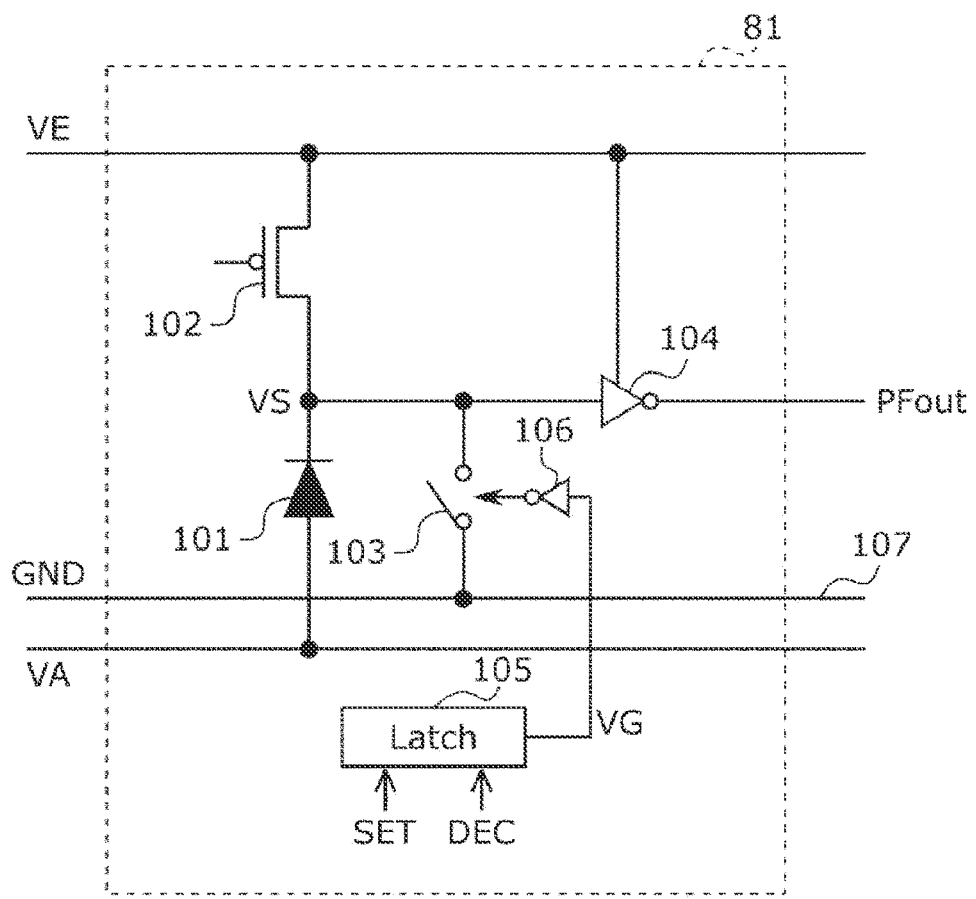
FIG. 3 is a diagram illustrating a circuit configuration example of a pixel.

FIG. 3 illustrates a circuit configuration example of each of the plurality of pixels 81 arrayed in a matrix in the pixel array 72.

The pixel 81 in FIG. 3 includes an SPAD 101, a transistor 102, a switch 103, and an inverter 104. Furthermore, the pixel 81 also includes a latch circuit 105 and an inverter 106. The transistor 102 is formed by a P-type MOS transistor.

A cathode of the SPAD 101 is connected to a drain of the transistor 102, and also connected to an input terminal of the inverter 104 and one end of the switch 103. An anode of the SPAD 101 is connected to a source voltage VA (hereinafter, will also be referred to as an anode voltage VA.).

The SPAD 101 is a photodiode (single photon avalanche photodiode) that causes avalanche amplification of generated electrons and outputs a signal of a cathode voltage VS, when incident light enters. The source voltage VA supplied to the anode of the SPAD 101 is set to a negative bias (negative potential) of about −20 V, for example.

The transistor 102 is a constant current source operating in a saturation region, and performs passive quench by functioning as a quenching resistor. A source of the transistor 102 is connected to a source voltage VE, and a drain is connected to the cathode of the SPAD 101, the input terminal of the inverter 104, and one end of the switch 103. Therefore, the source voltage VE is supplied also to the cathode of the SPAD 101. A pull-up resistor can also be used in place of the transistor 102 connected in series with the SPAD 101.

For detecting light (photon) with sufficient efficiency, a voltage (hereinafter, will be referred to as an excess bias.) larger than a breakdown voltage VBD of the SPAD 101 is applied to the SPAD 101. For example, if the breakdown voltage VBD of the SPAD 101 is set to 20 V, and a voltage larger to be than the breakdown voltage VBD by 3 V is applied, the source voltage VE to be supplied to the source of the transistor 102 is set to 3 V.

Note that the breakdown voltage VBD of the SPAD 101 drastically changes in accordance with a temperature or the like. Therefore, an applied voltage to be applied to the SPAD 101 is controlled (adjusted) in accordance with a change of the breakdown voltage VBD. For example, if the source voltage VE is set to a fixed voltage, the anode voltage VA is controlled (adjusted).

One end of both ends of the switch 103 is connected to the cathode of the SPAD 101, the input terminal of the inverter 104, and the drain of the transistor 102, and another end is connected to a ground connection line 107 connected to a ground (GND). The switch 103 can be formed by an N-type MOS transistor, for example, and turns on/off a gating control signal VG being an output of the latch circuit 105, in accordance with a gating inverted signal VG_I inverted by the inverter 106.

On the basis of a trigger signal SET and address data DEC that are supplied from the pixel drive unit 71, the latch circuit 105 supplies the gating control signal VG for controlling the pixel 81 to become an active pixel or an inactive pixel, to the inverter 106. The inverter 106 generates the gating inverted signal VG_I obtained by inverting the gating control signal VG, and supplies the gating inverted signal VG_I to the switch 103.

The trigger signal SET is a timing signal indicating a switching timing of the gating control signal VG, and the address data DEC is data indicating an address of a pixel to be set as an active pixel among the plurality of pixels 81 arrayed in the matrix in the pixel array 72. The trigger signal SET and the address data DEC are supplied from the pixel drive unit 71 via the pixel drive line 82.

The latch circuit 105 reads the address data DEC at a predetermined timing indicated by the trigger signal SET. Then, in a case where pixel addresses indicated by the address data DEC include a pixel address of itself (corresponding pixel 81), the latch circuit 105 outputs the gating control signal VG indicating Hi (1) for setting the corresponding pixel 81 as an active pixel. On the other hand, in a case where pixel addresses indicated by the address data DEC do not include a pixel address of itself (corresponding pixel 81), the latch circuit 105 outputs the gating control signal VG indicating Lo (0) for setting the corresponding pixel 81 as an inactive pixel. Therefore, in a case where the pixel 81 is set as an active pixel, the gating inverted signal VG_I inverted by the inverter 106 and indicating Lo (0) is supplied to the switch 103. On the other hand, in a case where the pixel 81 is set as an inactive pixel, the gating inverted signal VG_I indicating Hi (1) is supplied to the switch 103. Accordingly, in a case where the pixel 81 is set as an active pixel, the switch 103 is turned off (unconnected), and in a case where the pixel 81 is set as an inactive pixel, the switch 103 is turned on (connected).

When the cathode voltage VS serving as an input signal indicates Lo, the inverter 104 outputs a detection signal PFout indicating Hi, and when the cathode voltage VS indicates Hi, the inverter 104 outputs the detection signal PFout indicating Lo. The inverter 104 is an output unit that outputs the entry of a photon to the SPAD 101, as the detection signal PFout.

Next, an operation to be performed in a case where the pixel 81 is set as an active pixel will be described with reference to FIG. 4.

Figure 4:
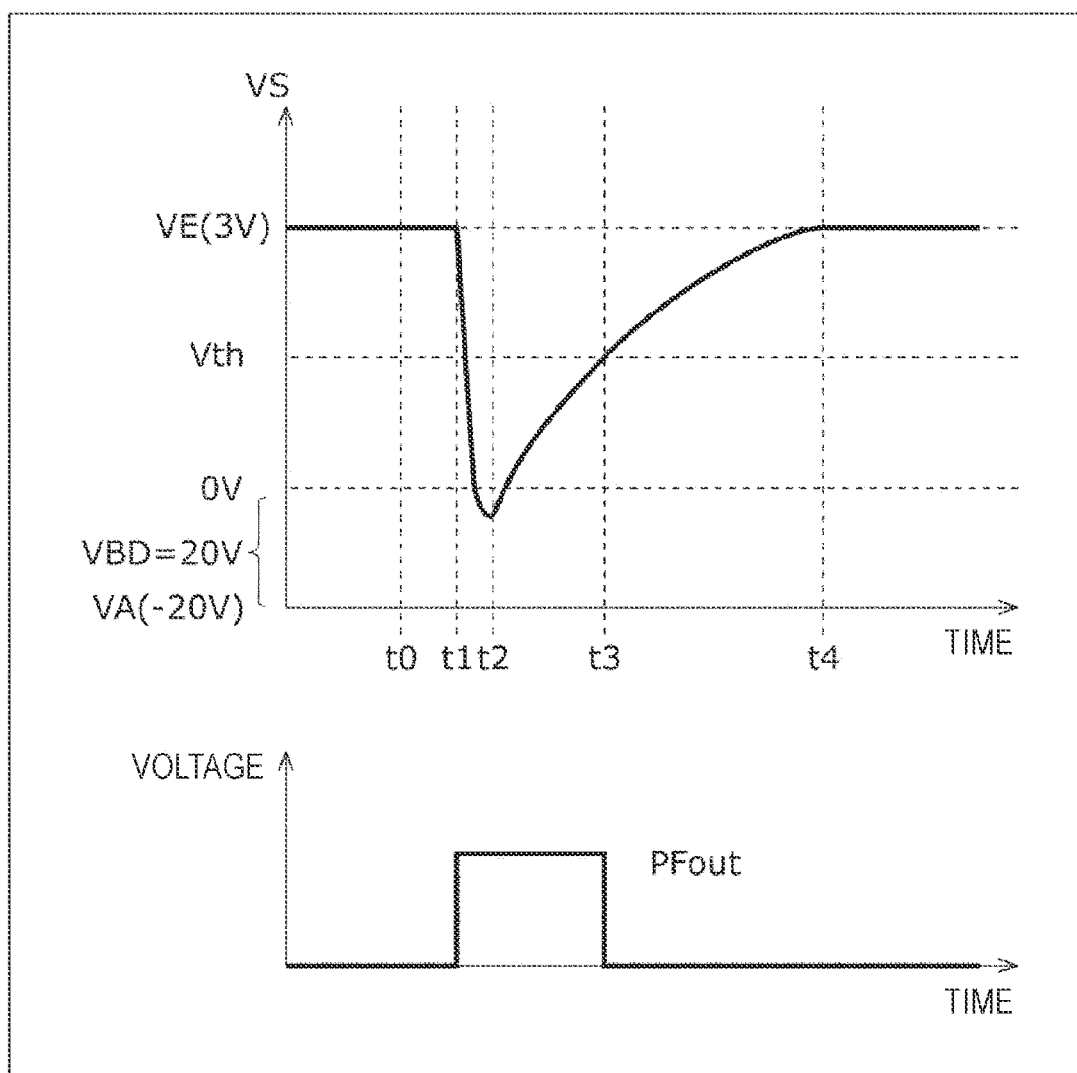
FIG. 4 is a diagram describing an operation of the pixel in FIG. 3.

FIG. 4 is a graph indicating a change of the cathode voltage VS of the SPAD 101 and the detection signal PFout that change in accordance with the entry of a photon.

First of all, in a case where the pixel 81 is set as an active pixel, the switch 103 is turned off as described above.

Because the source voltage VE (for example, 3 V) is supplied to the cathode of the SPAD 101, and the source voltage VA (for example, −20 V) is supplied to the anode, an inverse voltage larger than the breakdown voltage VBD (=20 V) is applied to the SPAD 101. The SPAD 101 is thereby set to a Geiger mode. In this state, the cathode voltage VS of the SPAD 101 is the same as the source voltage VE like the cathode voltage VS at a time t0 in FIG. 4, for example.

If a photon enters the SPAD 101 set to the Geiger mode, avalanche amplification occurs, and current flows in the SPAD 101.

If avalanche amplification occurs and current flows in the SPAD 101 at a time t1 in FIG. 4, after the time t1, by current flowing in the SPAD 101, current flows also in the transistor 102, and a voltage drop is caused by resistance components of the transistor 102.

If the cathode voltage VS of the SPAD 101 becomes lower than 0 V at a time t2, because an anode to cathode voltage of the SPAD 101 enters a state of being lower than the breakdown voltage VBD, avalanche amplification stops. Here, an operation of causing a voltage drop by flowing current generated by avalanche amplification, in the transistor 102, and stopping avalanche amplification by causing a state in which the cathode voltage VS is lower than the breakdown voltage VBD, in accordance with the caused voltage drop corresponds to a quench operation.

If avalanche amplification stops, current flowing in the resistor of the transistor 102 gradually decreases, and at a time t4, the cathode voltage VS returns to the original source voltage VE again, and a state in which a next new photon can be detected is caused (recharge operation).

The inverter 104 outputs the detection signal PFout indicating Lo, when the cathode voltage VS being an input voltage is equal to or larger than a predetermined threshold voltage Vth, and outputs the detection signal PFout indicating Hi, when the cathode voltage VS is smaller than the predetermined threshold voltage Vth. Accordingly, if a photon enters the SPAD 101, avalanche amplification occurs, and the cathode voltage VS drops to fall below the threshold voltage Vth, the detection signal PFout is inverted from a low level to a high level. On the other hand, if avalanche amplification of the SPAD 101 converges, and the cathode voltage VS rises to reach the threshold voltage Vth or more, the detection signal PFout is inverted from the high level to the low level.

Note that, in a case where the pixel 81 is set as an inactive pixel, the gating inverted signal VG_I indicating Hi (1) is supplied to the switch 103, and the switch 103 is turned on. If the switch 103 is turned on, the cathode voltage VS of the SPAD 101 is set to 0 V. Consequently, because the anode to cathode voltage of the SPAD 101 becomes equal to or smaller than the breakdown voltage VBD, a state in which the SPAD 101 does not react even if a photon enters the SPAD 101 is caused.

4. Plan View of Light Source and Pixel Array

In FIGS. 5A and 5B, FIG. 5A illustrates a plan view of the light source 32.

The light source 32 includes a plurality of light emission units 121 arrayed in a matrix. The light emission unit 121 includes a vertical cavity surface emitting laser (VCSEL), for example. The illumination control unit 31 can individually turn on and off the light emission units 121 arrayed in a matrix, in accordance with an emission code included in an emission signal supplied from the control unit 42.

In FIGS. 5A and 5B, FIG. 5B illustrates a plan view of the pixel array 72.

The pixel array 72 includes the pixels 81 two-dimensionally arrayed in a matrix as described above. Each of the pixels 81 is functionally classified into a pixel 81M, a pixel 81R, or a pixel 81D.

The pixel 81M is a pixel that receives reflected light of light that has been emitted from (the light emission units 121 of) the light source 32 and reflected by the subject 12, the subject 13, and the like, and is a measurement (distance measurement) pixel for measuring a distance to a subject.

The pixel 81R is a reference pixel used for checking an adequate applied voltage to the SPAD 101, and correcting distance data.

The pixel 81D is a dummy pixel for separating the measurement pixel 81M and the reference pixel 81R. The dummy pixel 81D can be a pixel having the same pixel structure as the measurement pixel 81M, for example, and being different only in that the dummy pixel 81D is merely not driven. Alternatively, furthermore, the dummy pixel 81D may have the same pixel structure as the measurement pixel 81M, and is driven for monitoring an internal voltage.

The numbers of pixels 81M, pixels 81R, and pixels 81D are not specifically limited as long as a plurality of measurement pixels 81M is arrayed in a matrix, and the dummy pixel 81D is arrayed between the measurement pixels 81M and the reference pixel 81R. The measurement pixels 81M can be arrayed in N1×N2 (N1 and N2 are integers equal to or larger than 1), the reference pixels 81R can be arrayed in M1×M2 (M1 and M2 are integers equal to or larger than 1), and the dummy pixels 81D can be arrayed in L1×L2 (L1 and L2 are integers equal to or larger than 1).

Furthermore, in the example in FIGS. 5A and 5B, a plurality of reference pixels 81R is adjacently arrayed, but the reference pixels 81R may be separately arrayed among the dummy pixels 81D, and the dummy pixel 81D may be arrayed between a pixel 81R and another pixel 81R.

5. Pixel Cross-Sectional View

In FIGS. 6A and 6B, FIG. 6A illustrates a cross-sectional view of the measurement pixel 81M.

The pixel 81M includes a first substrate 201 and a second substrate 202 that are bonded to each other. The first substrate 201 includes a semiconductor substrate 211 containing silicon or the like, and a wiring layer 212. Hereinafter, for clearly distinguishing from a wiring layer 312 on the second substrate 202 side, which will be described later, the wiring layer 212 will be referred to as the sensor side wiring layer 212. The wiring layer 312 on the second substrate 202 side will be referred to as the logic side wiring layer 312. A surface of the semiconductor substrate 211 on which the sensor side wiring layer 212 is formed is a front surface, and the back surface on which the sensor side wiring layer 212 is not formed, and which is located on the upper side in the drawing corresponds to a light receiving surface that reflected light enters.

A pixel region of the semiconductor substrate 211 includes an N well 221, a P-type diffusion layer 222, an N-type diffusion layer 223, a hole storage layer 224, and a high-concentration P-type diffusion layer 225. Then, an avalanche amplification region 257 is formed by a depletion layer formed in a region in which the P-type diffusion layer 222 and the N-type diffusion layer 223 are connected.

The N well 221 is formed by impurity concentration of the semiconductor substrate 211 being controlled to an n-type, and forms an electric field for transferring electrons generated by photoelectric conversion in the pixel 81M, to the avalanche amplification region 257. At the central part of the N well 221, an n-type region 258 having higher concentration than the N well 221 is formed in contact with the P-type diffusion layer 222, and a potential gradient for causing carriers (electrons) generated in the N well 221, to easily drift from the periphery to the center is formed. Note that, in place of the N well 221, a P well may be formed by controlling impurity concentration of the semiconductor substrate 211 to a p-type.

The P-type diffusion layer 222 is a high-concentration P-type diffusion layer (P+) formed over the entire surface of the pixel region in a planar direction. The N-type diffusion layer 223 is a high-concentration N-type diffusion layer (N+) existing near the front surface of the semiconductor substrate 211, and formed over the entire surface of the pixel region similarly to the P-type diffusion layer 222. The N-type diffusion layer 223 is a contact layer connecting with a contact electrode 281 serving as a cathode electrode for supplying a negative voltage for forming the avalanche amplification region 257, and has a protruding shape partially formed up to the contact electrode 281 on the front surface of the semiconductor substrate 211.

The hole storage layer 224 is a P-type diffusion layer (P) formed in such a manner as to surround the side surfaces and the bottom surface of the N well 221, and stores holes. Furthermore, the hole storage layer 224 is connected with the high-concentration P-type diffusion layer 225 electrically connected with a contact electrode 282 serving as an anode electrode of the SPAD 101.

The high-concentration P-type diffusion layer 225 is a high-concentration P-type diffusion layer (P++) existing near the front surface of the semiconductor substrate 211 and formed in such a manner as to surround the outer periphery of the N well 221, and forms a contact layer for electrically connecting the hole storage layer 224 with the contact electrode 282 of the SPAD 101.

In a pixel boundary portion of the semiconductor substrate 211 that serves as a boundary with a neighboring pixel, a pixel separation unit 259 for separating pixels is formed. The pixel separation unit 259 may include only an insulation layer, for example, or may have a double structure in which an insulation layer containing SiO2 or the like covers the outer side (the N well 221 side) of a metal layer containing tungsten or the like.

In the sensor side wiring layer 212, the contact electrodes 281 and 282, metal wires 283 and 284, contact electrodes 285 and 286, and metal wires 287 and 288 are formed.

The contact electrode 281 connects the N-type diffusion layer 223 and the metal wire 283, and the contact electrode 282 connects the high-concentration P-type diffusion layer 225 and the metal wire 284.

The metal wire 283 is formed to be wider than the avalanche amplification region 257 in such a manner as to cover at least the avalanche amplification region 257 in a planar region. Furthermore, the metal wire 283 may have a structure for causing light having passed through the pixel region of the semiconductor substrate 211, to be reflected toward the semiconductor substrate 211 side.

The metal wire 284 is formed in such a manner as to overlap with the high-concentration P-type diffusion layer 225 and surround the outer periphery of the metal wire 283 in the planar region.

The contact electrode 285 connects the metal wire 283 and the metal wire 287, and the contact electrode 286 connects the metal wire 284 and the metal wire 288.

On the other hand, the second substrate 202 includes a semiconductor substrate 311 containing silicon or the like, and the wiring layer 312 (the logic side wiring layer 312).

On the front surface side of the semiconductor substrate 311 that corresponds to the upper side in the drawing, a plurality of MOS transistors Tr (Tr1, Tr2, etc.) is formed, and the logic side wiring layer 312 is formed.

The logic side wiring layer 312 includes metal wires 331 and 332, metal wires 333 and 334, and contact electrodes 335 and 336.

The metal wire 331 is electrically and physically connected with the metal wire 287 of the sensor side wiring layer 212 by metal bonding of Cu—Cu or the like. The metal wire 332 is electrically and physically connected with the metal wire 288 of the sensor side wiring layer 212 by metal bonding of Cu—Cu or the like.

The contact electrode 335 connects the metal wire 331 and the metal wire 333, and the contact electrode 336 connects the metal wire 332 and the metal wire 334.

The logic side wiring layer 312 further includes a multi-layer metal wire 341 between the layer of the metal wires 333 and 334, and the semiconductor substrate 311.

A logic circuit corresponding to the pixel drive unit 71, the MUX 73, the time measurement unit 74, the signal processing unit 75, and the like is formed in the second substrate 202 by the plurality of MOS transistors Tr formed on the semiconductor substrate 311, and the multilayer metal wire 341.

For example, via the logic circuit formed on the second substrate 202, the source voltage VE to be applied the N-type diffusion layer 223 is supplied to the N-type diffusion layer 223 via the metal wires 333, the contact electrode 335, the metal wires 331 and 287, the contact electrode 285, the metal wire 283, and the contact electrode 281. Furthermore, the source voltage VA is supplied to the high-concentration P-type diffusion layer 225 via the metal wire 334, the contact electrode 336, the metal wires 332 and 288, the contact electrode 286, the metal wire 284, and the contact electrode 282. Note that, in a case where a P well obtained by controlling impurity concentration of the semiconductor substrate 211 to a p-type is formed in place of the N well 221, a voltage to be applied to the N-type diffusion layer 223 becomes the source voltage VA, and a voltage to be applied to the high-concentration P-type diffusion layer 225 becomes the source voltage VE.

The cross-sectional structure of the measurement pixel 81M has the above-described configuration, and the SPAD 101 serving as a light receiving element includes the N well 221 of the semiconductor substrate 211, the P-type diffusion layer 222, the N-type diffusion layer 223, the hole storage layer 224, and the high-concentration P-type diffusion layer 225, and the hole storage layer 224 is connected with the contact electrode 282 serving as an anode electrode, and the N-type diffusion layer 223 is connected with the contact electrode 281 serving as a cathode electrode.

At least one layer of the metal wires 283, 284, 287, 288, 331 to 334, or 341 serving as a light shielding member is disposed between the semiconductor substrate 211 of the first substrate 201 and the semiconductor substrate 311 of the second substrate 202 in all regions in the planar direction of the pixel 81M. Therefore, even in a case where light is emitted by hot carries of the MOS transistor Tr of the semiconductor substrate 311 of the second substrate 202, the light is configured not to reach the N well 221 and the n-type region 258 of the semiconductor substrate 211 serving as a photoelectric conversion region.

In the pixel 81M, the SPAD 101 serving as a light receiving element has a light receiving surface including planes of the N well 221 and the hole storage layer 224, and the MOS transistor Tr serving as a light emission source that performs hot carrier light emission is provided on the opposite side of the light receiving surface of the SPAD 101. Then, the metal wire 283 and the metal wire 341 serving as a light shielding member are provided between the SPAD 101 serving as a light receiving element, and the MOS transistor Tr serving as a light emission source, and hot carrier light emission is configured not to reach the N well 221 and the n-type region 258 of the semiconductor substrate 211 serving as a photoelectric conversion region.

A pixel structure of the dummy pixel 81D is formed by the same structure as the measurement pixel 81M.

In FIGS. 6A and 6B, FIG. 6B illustrates a cross-sectional view of the reference pixel 81R.

Note that, in FIG. 6B, parts corresponding to FIG. 6A are assigned the same reference numerals, and the description thereof will be appropriately omitted.

The cross-sectional structure of the reference pixel 81R illustrated in FIG. 6B is different from that of the measurement pixel 81M illustrated in FIG. 6A in that a light guiding unit 361 that propagates light (photon) generated by hot carrier light emission is provided between the SPAD 101 serving as a light receiving element and the MOS transistor Tr serving as a light emission source that performs hot carrier light emission.c More specifically, in a part of regions of all regions in the planar direction between the semiconductor substrate 211 of the first substrate 201 and the semiconductor substrate 311 of the second substrate 202 of the pixel 81R, a region in which none of the metal wires 283, 284, 287, 288, 331 to 334, and 341 that shield light is formed is provided, and the light guiding unit 361 that propagates light is formed in a stack direction of metal wires.

Therefore, as for a position in the planar direction, if hot carrier light emission occurs in the MOS transistor Tr1 formed at a position overlapping the light guiding unit 361 at least partially, the SPAD 101 of the pixel 81R can receive light generated by hot carrier light emission and having passed through the light guiding unit 361, and output a detection signal (pixel signal). Note that all the metal wires 283, 341, and the like need not be completely opened as described above, and the light guiding unit 361 is only required to be opened to such an extent that light passes through.

Furthermore, on the top surface of the hole storage layer 224 being the light receiving surface side of the pixel 81R, a light shielding member (light shielding layer) 362 is formed in such a manner as to surround the light receiving surface of the hole storage layer 224. The light shielding member 362 shields ambient light or the like that enters from the light receiving surface side. Note that, because the influence of ambient light or the like can be removed by generation processing of a histogram as described above, the light shielding member 362 is not essential and can be omitted.

The MOS transistor Tr1 that emits light propagating through the light guiding unit 361 and reaching the photoelectric conversion region of the pixel 81R may be a MOS transistor provided as a light emission source as a circuit element not provided in the measurement pixel 81M, or may be a MOS transistor formed also in the measurement pixel 81M.

Accordingly, in a case where the MOS transistor Tr1 is provided as a light emission source peculiarly in the reference pixel 81R, a circuit in the pixel region formed in the second substrate 202 is different between the reference pixel 81 and the measurement pixel 81M. In this case, the MOS transistor Tr1 peculiarly provided as a light emission source corresponds to a circuit that controls the light emission source, for example.

A light emission timing at which the MOS transistor Tr1 peculiarly provided as a light emission source is caused to emit light can be set to the same timing as a timing at which the light emission units 121 of the light source 32 emit light, for example. In this case, for example, by setting a timing at which the reference pixel 81R receives light from the light emission source (MOS transistor Tr1), as a reference of a distance zero, it is possible to correct a distance to be calculated from a timing at which the measurement pixel 81M receives light. In other words, the reference pixel 81R can be used for correcting distance data.

Furthermore, for example, the reference pixel 81R can be used for checking adequateness of an applied voltage to the SPAD 101. In this case, in the pixel 81R, the MOS transistor Tr1 peculiarly provided as a light emission source is caused to emit light, and the cathode voltage VS of the SPAD 101 at the time of a quench operation, that is to say, the cathode voltage VS at the time t2 in FIG. 4 can be checked and used for adjusting the anode voltage VA.

On the other hand, in a case where the MOS transistor Tr1 serving as a light emission source is a MOS transistor formed also in the measurement pixel 81M, a circuit in the pixel region formed in the second substrate 202 can be made the same between the reference pixel 81 and the measurement pixel 81M.

Note that the light emission source of the reference pixel 81R is not limited to a MOS transistor, and may be another circuit element such as a diode or a resistor element.

Furthermore, the light receiving device 52 has a stack structure in which the first substrate 201 and the second substrate 202 are bonded to each other as described above, but may include a single substrate (semiconductor substrate), or may have a stack structure of three or more substrates. Moreover, a back side light receiving sensor structure in which the back surface side of the first substrate 201 that is opposite to the front surface on which the sensor side wiring layer 212 is formed is regarded as a light receiving surface is employed, but a front side light receiving sensor structure may be employed.

6. Comparative Example

Figure 7:
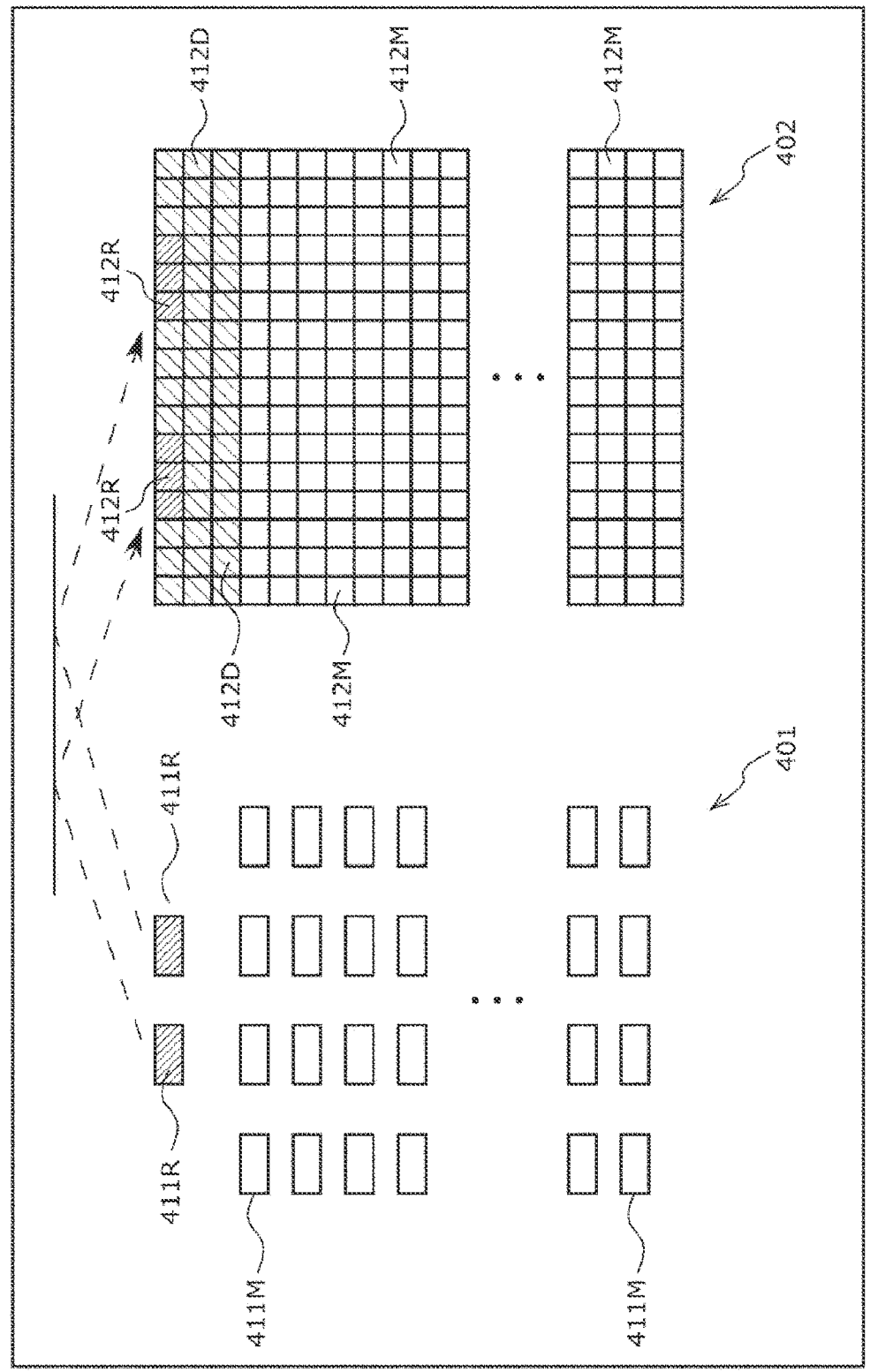
FIG. 7 is a diagram illustrating a configuration example of a light source and a pixel array in another distance measurement system according to a comparative example.

FIG. 7 illustrates a configuration example of a light source and a pixel array in another distance measurement system according to a comparative example to be compared with the structures of the light source 32 and the pixel array 72 of the distance measurement system 11.

A light source 401 in FIG. 7 includes a plurality of light emission units 411M arrayed in a matrix, and a plurality of light emission units 411R. The light emission units 411M and the light emission units 411R each include a vertical cavity surface emitting laser (VCSEL), for example, similarly to the light emission units 121 of the light source 32.

As compared with the configuration of the light source 32 of the distance measurement system 11 illustrated in FIGS. 5A and 5B, the light emission units 411M correspond to the light emission units 121, and the light source 401 further includes the light emission units 411R in addition to the light emission units 121. The light emission units 411R are reference light emission units 411 provided for emitting light onto reference pixels 412R of a pixel array 402.

In the pixel array 402 in FIG. 7, measurement pixels 412M, reference pixels 412R, and dummy pixels 412D are arrayed in an alignment similar to that of the pixel array 72 in FIGS. 5A and 5B. Nevertheless, all of the pixel structures of the pixels 412M, the pixels 412R, and the pixels 412D have the same structure as the structure of the measurement pixel 81M illustrated in FIG. 6A.

More specifically, similarly to the measurement pixel 412M, the reference pixel 412R has a configuration in which the reference pixel 412R includes a light shielding member that shields light emitted by hot carrier, in such a manner as not to reach a photoelectric conversion region, between the SPAD 101 and the MOS transistor Tr serving as a light emission source, and light emitted from the reference light emission units 411R is received from the light receiving surface side.

In such a configuration, as compared with the distance measurement system 11 illustrated in FIGS. 5A and 5B, because the light emission units 411R for the reference pixels 412R are additionally required, a mounting area of the light emission units 411R is required, and power for driving the light emission units 411R increases. Power consumption accordingly increases as well. Furthermore, an optical axis needs to be adjusted in such a manner that light emitted from the light emission units 411R is received by the reference pixels 412R, and such a configuration is susceptible to an optical axis deviation.

In contrast to this, according to the structures of the light source 32 and the pixel array 72 of the distance measurement system 11, because the light emission units 411R for the reference pixels 412R become unnecessary, not only power saving can be achieved but also adjustment of an optical axis deviation becomes unnecessary. Then, because a light emission source is provided in the pixel region of the reference pixel 81R, specifically, provided on the opposite side of the light receiving surface of the SPAD 101, and the light guiding unit 361 that propagates light is provided, light can be surely received.

7. Another Array Example of Pixels

Figure 8:
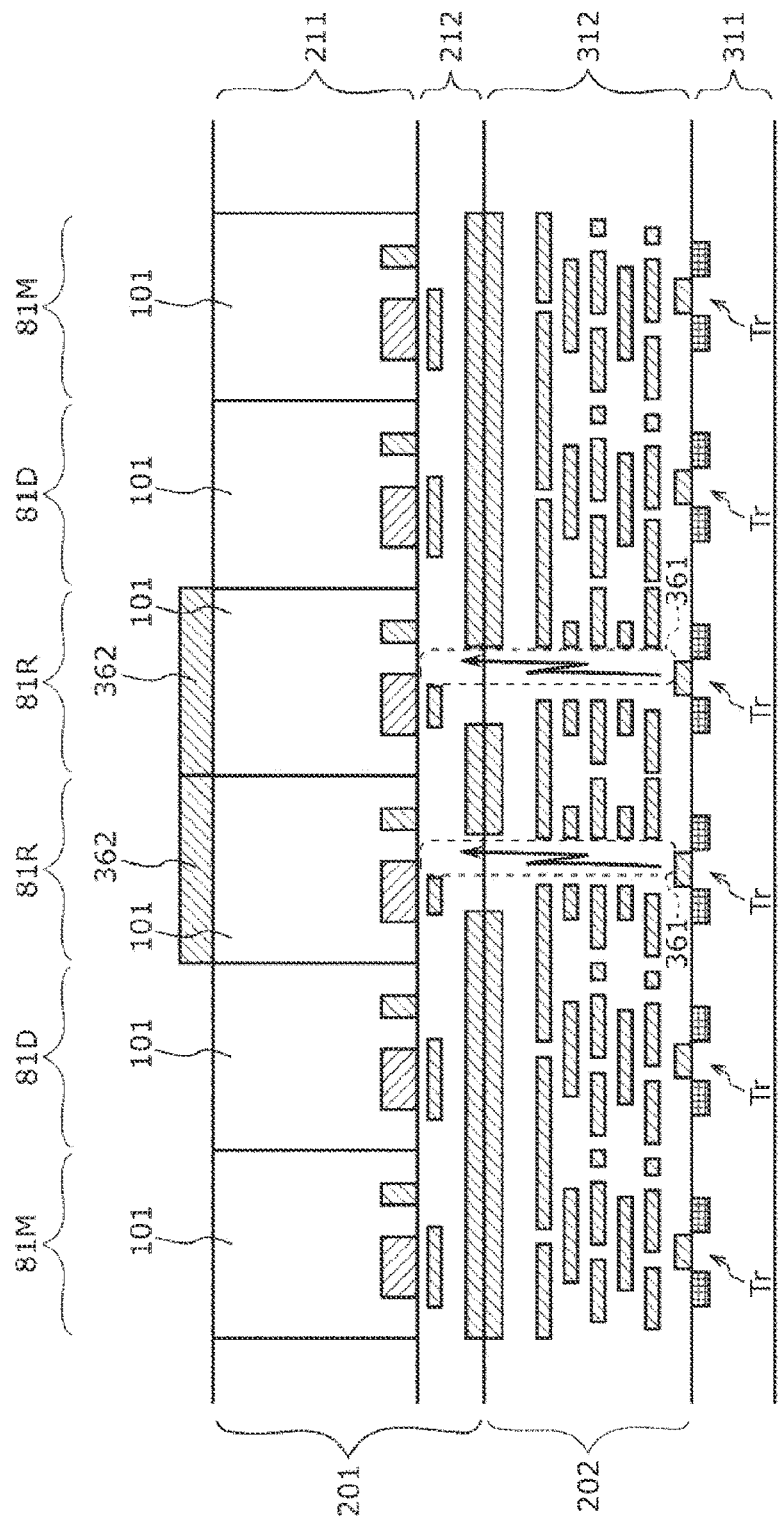
FIG. 8 is a cross-sectional view illustrating another array example of pixels.

FIG. 8 is a cross-sectional view illustrating another array example of pixels in the pixel array 72.

In the cross-sectional view of FIG. 8, parts corresponding to FIGS. 6A and 6B are assigned the same reference numerals. The structure illustrated in FIGS. 6A and 6B are further simplified, and a part of the reference numerals is omitted.

In the array example of the pixel array 72 illustrated in FIGS. 5A and 5B, the reference pixels 81R are arranged on a pixel row or a pixel column separated from the measurement pixels 81M over the dummy pixels 81D, but the reference pixels 81R and the measurement pixels 81M may be arranged on the same pixel row or pixel column.

The cross-sectional view of FIG. 8 illustrates a cross-sectional view of the pixels 81 arranged on one pixel row or pixel column.

As illustrated in FIG. 8, the reference pixels 81R and the measurement pixels 81M can be arranged on the same pixel row or pixel column. Also in this case, it is desirable that the dummy pixel 81D is arranged between the reference pixel 81R and the measurement pixel 81M. Therefore, even in a case where light from the MOS transistor Tr serving as a light emission source of the reference pixel 81R leaks to a neighboring pixel 81, the influence on the measurement pixel 81M can be suppressed. Note that the dummy pixel 81D between the reference pixel 81R and the measurement pixel 81M may be omitted.

8. Usage Example of Distance Measurement System

The application of the present technology is not limited to application to a distance measurement system. More specifically, the present technology can be applied to general electronic devices such as a smartphone, a tablet terminal, a mobile phone, a personal computer, a game machine, a television receiver, a wearable terminal, a digital still camera, or a digital video camera, for example. The above-described imaging unit 41 may have a module configuration in which the lens 51 and the light receiving device 52 are collectively packaged, or may have a configuration in which the lens 51 and the light receiving device 52 are separately formed, and only the light receiving device 52 is formed as one chip.

Figure 9:
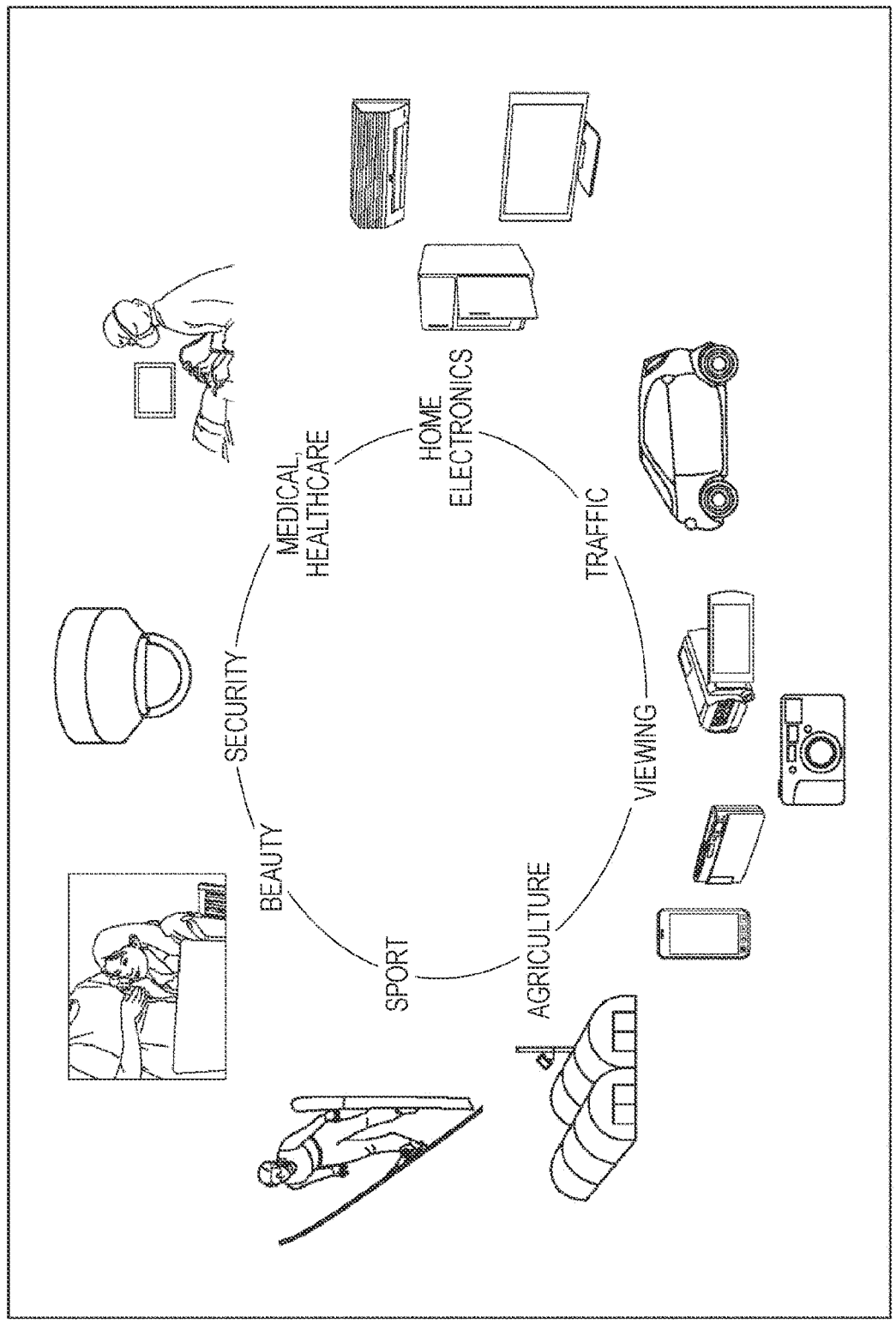
FIG. 9 is a diagram describing a usage example of a distance measurement system.

FIG. 9 is a diagram illustrating a usage example of the above-described distance measurement system 11 or the light receiving device 52.

The above-described distance measurement system 11 can be used in various cases of sensing light such as visible light, infrared light, ultraviolet, or an X-ray, for example, as described below.

- A device that captures an image to be used for viewing, such as a digital camera or a portable device equipped with a camera function
- A device to be used for traffic, such as an in-vehicle sensor that captures images of a front side, a rear side, and a periphery of an automobile, the inside of the vehicle, and the like for safe driving such as an automatic stop, recognition of a state of a driver, and the like, a monitoring camera that monitors a running vehicle and

- a road, or a distance measurement sensor that measures a distance such as an inter-vehicular distance
- A device used in home electronics such as a TV, a refrigerator, or an air conditioner, for capturing an image of a gesture of a user, and performing a device operation suitable for the gesture
- A device used for medical and healthcare, such as an endoscope or a device that captures an image of blood vessels by receiving infrared light
- A device used for security, such as a monitoring camera intended for crime prevention, or a camera intended for human authentication
- A device used for beauty, such as a skin measuring device that captures an image of a skin, or a microscope that captures an image of a skin of scalp
- A device used for sport, such as an action camera or a wearable camera intended for sport or the like
- A device used for agriculture, such as a camera for monitoring a state of a field or a crop

9. Application Example to Movable Body

The technology according to the present disclosure (present technology) can be applied to various products. For example, the technology according to the present disclosure can be implemented as a device mounted on a movable body of any type of an automobile, an electric car, a hybrid electric car, a motorbike, a bicycle, a personal mobility, a plane, a drone, a ship, a robot, and the like.

Figure 10:
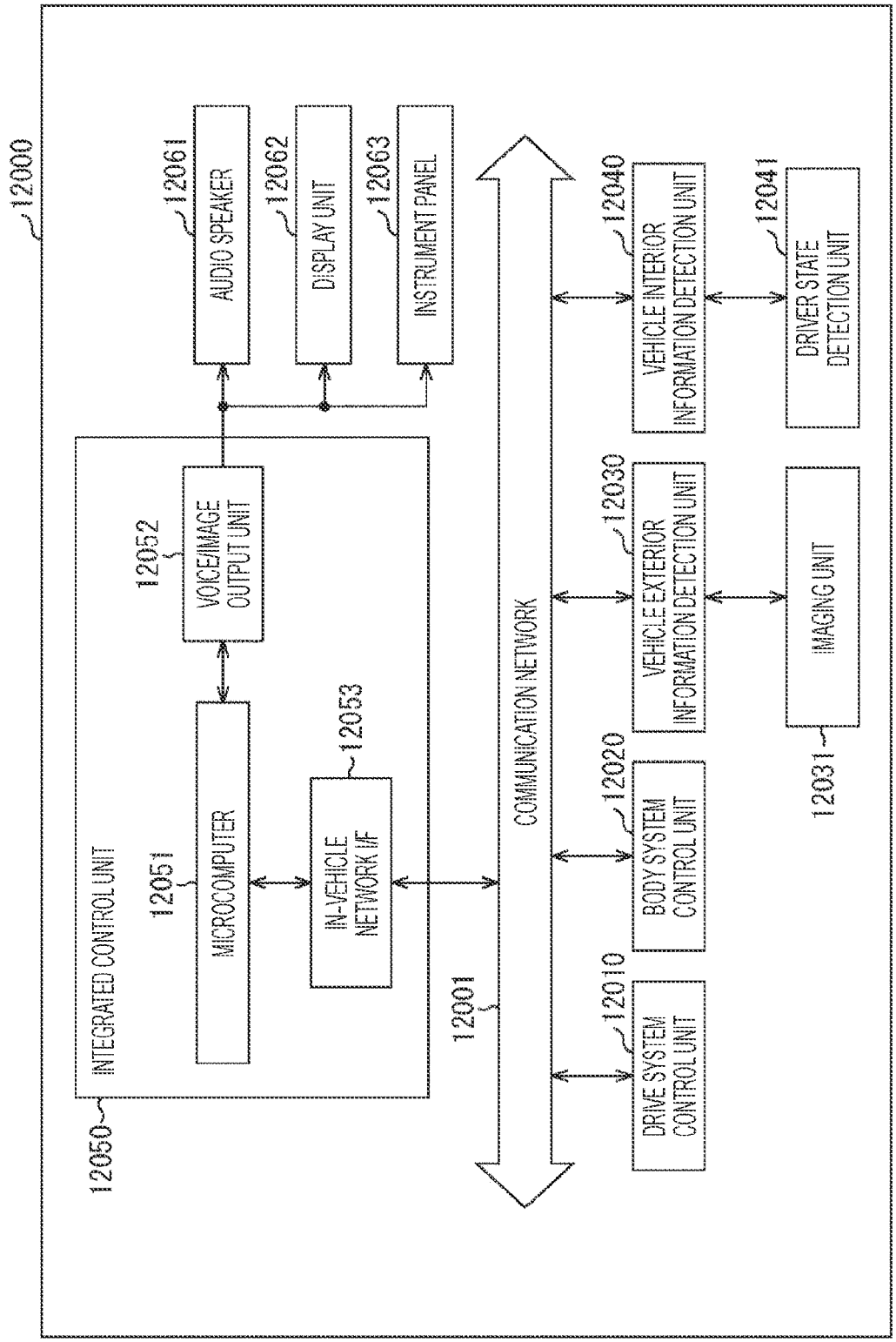
FIG. 10 is a block diagram illustrating an example of a schematic configuration of a vehicle control system.

FIG. 10 is a block diagram illustrating a schematic configuration example of a vehicle control system being an example of a movable body control system to which the technology according to the present disclosure can be applied.

A vehicle control system 12000 includes a plurality of electronic control units connected via a communication network 12001. In the example illustrated in FIG. 10, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a voice/image output unit 12052, and an in-vehicle network interface (I/F) 12053 are illustrated.

The drive system control unit 12010 controls operations of a device related to a drive system of a vehicle in accordance with various programs. For example, the drive system control unit 12010 functions as a control device of a drive force generation device for generating drive force of a vehicle, such as an internal-combustion engine or a driving motor, a drive force transmission mechanism for transmitting drive force to wheels, a steering mechanism for adjusting a steering angle of the vehicle, a braking device for generating braking force of the vehicle, and the like.

The body system control unit 12020 controls operations of various devices provided in a vehicle body, in accordance with various programs. For example, the body system control unit 12020 functions as a control device of a keyless entry system, a smart key system, a powered window device, or various lamps such as a headlamp, a back lamp, a brake lamp, a blinker, or a fog lamp. In this case, radio waves transmitted from a mobile device substituting for a key, or signals of various switches can be input to the body system control unit 12020. The body system control unit 12020 receives input of these radio waves or signals, and controls a door lock device of the vehicle, the powered window device, lamps, and the like.

The vehicle exterior information detection unit 12030 detects information regarding the outside of the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image of the outside of the vehicle, and receives the captured image. On the basis of the received image, the vehicle exterior information detection unit 12030 may perform object detection processing or distance detection processing of a human, a car, an obstacle, a road sign, characters on a road, and the like.

The imaging unit 12031 is an optical sensor that receives light and outputs an electrical signal corresponding to a light reception amount of the light. The imaging unit 12031 can output an electrical signal as an image, and output an electrical signal as information regarding distance measurement. Furthermore, light to be received by the imaging unit 12031 may be visible light, or may be invisible light such as infrared light.

The vehicle interior information detection unit 12040 detects information regarding the vehicle interior. For example, a driver state detection unit 12041 that detects a state of a driver is connected to the vehicle interior information detection unit 12040. The driver state detection unit 12041 includes a camera for capturing an image of a driver, for example. On the basis of detection information input from the driver state detection unit 12041, the vehicle interior information detection unit 12040 may calculate a fatigue degree or a concentration degree of the driver, or may determine whether or not the driver dozes off.

On the basis of information regarding the vehicle interior or vehicle exterior that is acquired by the vehicle exterior information detection unit 12030 or the vehicle interior information detection unit 12040, the microcomputer 12051 can calculate control target values of the drive force generation device, the steering mechanism, or the braking device, and output a control command to the drive system control unit 12010. For example, the microcomputer 12051 can perform cooperative control intended to implement functions of an advanced driver assistance system (ADAS) including collision avoidance or shock mitigation of the vehicle, follow-up driving that is based on an inter-vehicular distance, maintained vehicle speed driving, collision warning of the vehicle, lane deviation warning of the vehicle, or the like.

Furthermore, the microcomputer 12051 can perform cooperative control intended for automated driving of autonomously driving without depending on the operation of a driver, or the like, by controlling the drive force generation device, the steering mechanism, the braking device, or the like on the basis of information regarding the periphery of the vehicle that is acquired by the vehicle exterior information detection unit 12030 or the vehicle interior information detection unit 12040.

Furthermore, the microcomputer 12051 can output a control command to the body system control unit 12020 on the basis of information regarding the vehicle exterior that is acquired by the vehicle exterior information detection unit 12030. For example, the microcomputer 12051 can perform cooperative control intended to achieve antidazzle by controlling a headlamp in accordance with a position of a leading vehicle or an oncoming vehicle that has been detected by the vehicle exterior information detection unit 12030, and switching high beam to low beam, or the like.

The voice/image output unit 12052 transmits an output signal of at least one of voice or an image to an output device that can visually or aurally notify an occupant of the vehicle or the vehicle exterior of information. In the example in FIG. 10, an audio speaker 12061, a display unit 12062, and an instrument panel 12063 are exemplified as output devices. The display unit 12062 may include at least one of an onboard display or a headup display, for example.

Figure 11:
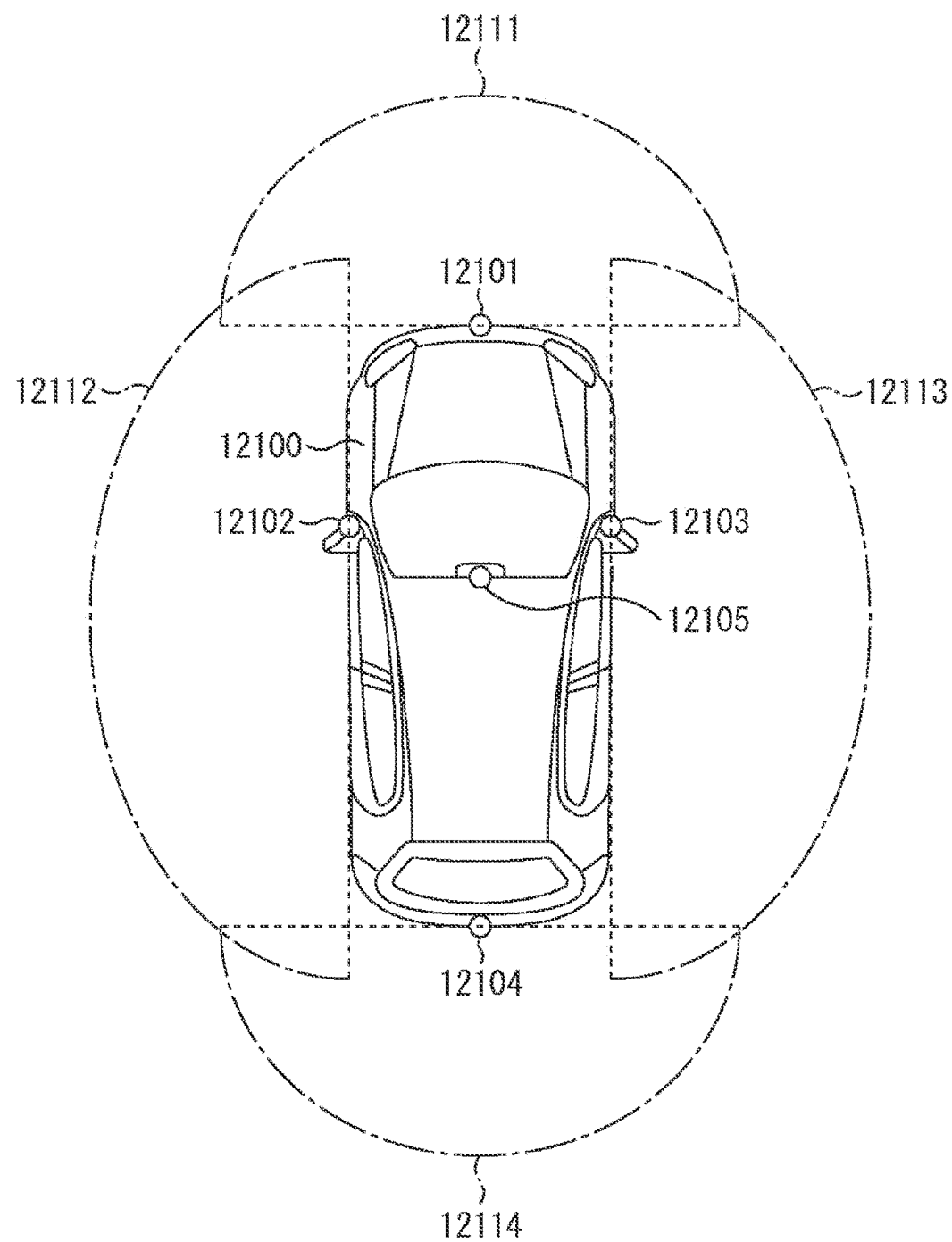
FIG. 11 is an explanatory diagram illustrating an example of installation positions of a vehicle exterior information detection unit and an imaging unit.

FIG. 11 is a diagram illustrating an example of an installation position of the imaging unit 12031.

In FIG. 11, a vehicle 12100 includes imaging units 12101, 12102, 12103, 12104, and 12105 as the imaging unit 12031.

The imaging units 12101, 12102, 12103, 12104, and 12105 are provided at positions such as a front nose of the vehicle 12100, side mirrors, a rear bumper, a backdoor, and an upper part of a front window inside a vehicle room, for example. The imaging unit 12101 provided at the front nose and the imaging unit 12105 provided at the upper part of the front window inside the vehicle room mainly acquire images of a front side of the vehicle 12100. The imaging units 12102 and 12103 provided at the side mirrors mainly acquire images of the sides of the vehicle 12100. The imaging unit 12104 provided at the rear bumper or the backdoor mainly acquires images of the back side of the vehicle 12100. The images of the front side that are acquired by the imaging units and 12101 and 12105 are mainly used for the detection of a leading vehicle, a pedestrian, an obstacle, a traffic light, a traffic sign, a traffic lane, or the like.

Note that FIG. 11 illustrates an example of image capturing ranges of the imaging units 12101 to 12104. An image capturing range 12111 indicates an image capturing range of the imaging unit 12101 provided at the front nose, image capturing ranges 12112 and 12113 respectively indicate image capturing ranges of the imaging units 12102 and 12103 provided at the side mirrors, and an image capturing range 12114 indicates an image capturing range of the imaging unit 12104 provided at the rear bumper or the backdoor. For example, a birds-eye image of the vehicle 12100 viewed from above is obtained by overlapping image data captured by the imaging units 12101 to 12104.

At least one of the imaging units 12101 to 12104 may have a function of acquiring distance information. For example, at least one of the imaging units 12101 to 12104 may be a stereo camera including a plurality of image sensors, or may be an image sensor including pixels for phase difference detection.

For example, by obtaining a distance to each three-dimensional object in the image capturing ranges 12111 to 12114, and a temporal variation (relative speed with respect to the vehicle 12100) of the distance, on the basis of distance information acquired from the imaging units 12101 to 12104, the microcomputer 12051 can especially extract, as a leading vehicle, a three-dimensional object that is the closest three-dimensional object existing on a travelling path of the vehicle 12100, and is running at a predetermined speed (for example, equal to or larger than 0 km/h) in substantially the same direction as the vehicle 12100. Moreover, the microcomputer 12051 can preliminarily set an inter-vehicular distance to be ensured in front of a leading vehicle, and perform automatic brake control (including follow-up stop control), automatic acceleration control (including follow-up departure control), and the like. In this manner, cooperative control intended for automated driving of autonomously driving without depending on the operation of a driver, or the like can be performed.

For example, on the basis of distance information acquired from the imaging units 12101 to 12104, the microcomputer 12051 can extract three-dimensional object data regarding a three-dimensional object, while classifying three-dimensional objects into other three-dimensional objects such as a two-wheeled vehicle, a standard-sized vehicle, a large-sized vehicle, a pedestrian, and a telephone pole, and use the extracted three-dimensional object data for automatic avoidance of an obstacle. For example, the microcomputer 12051 identifies obstacles near the vehicle 12100, as an obstacle visible by a driver of the vehicle 12100, and an obstacle less-visible by the driver. Then, the microcomputer 12051 determines collision risk indicating a degree of risk of collision with each obstacle, and when the collision risk is equal to or larger than a setting value and there is a possibility of collision, the microcomputer 12051 can perform drive assist for collision avoidance by outputting a warning to the driver via the audio speaker 12061 or the display unit 12062, and performing forced deceleration or avoidance steering via the drive system control unit 12010.

At least one of the imaging units 12101 to 12104 may be an infrared camera that detects infrared light. For example, the microcomputer 12051 can recognize a pedestrian by determining whether or not a pedestrian exists in captured images of the imaging units 12101 to 12104. The recognition of a pedestrian is performed by a procedure of extracting feature points in captured images of the imaging units 12101 to 12104 serving as infrared cameras, and a procedure of determining whether or not a detected object is a pedestrian, by performing pattern matching processing on a series of feature points indicating an outline of the object, for example. If the microcomputer 12051 determines that a pedestrian exists in captured images of the imaging units 12101 to 12104, and recognizes the pedestrian, the voice/image output unit 12052 controls the display unit 12062 to display a rectangular profile line for enhancement, with being superimposed on the recognized pedestrian. Furthermore, the voice/image output unit 12052 may control the display unit 12062 to display an icon indicating the pedestrian, or the like at a desired position.

Heretofore, an example of the vehicle control system to which the technology according to the present disclosure can be applied has been described. The technology according to the present disclosure can be applied to the imaging unit 12031 or the like among the configurations described above. Specifically, for example, the distance measurement system 11 in FIG. 1 can be applied to the imaging unit 12031. The imaging unit 12031 is a LIDAR, for example, and is used for detecting an object near the vehicle 12100 and a distance to the object. By applying the technology according to the present disclosure to the imaging unit 12031, detection accuracy of an object near the vehicle 12100 and a distance to the object enhances. Consequently, for example, it becomes possible to perform collision warning of a vehicle at an appropriate timing, and prevent a traffic accident.

Note that, in this specification, a system means a set of a plurality of constituent elements (apparatuses, modules (parts), and the like), and it does not matter whether or not all the constituent elements are provided in the same casing. Thus, a plurality of apparatuses stored in separate casings and connected via a network, and a single apparatus in which a plurality of modules is stored in a single casing are both regarded as systems.

Furthermore, an embodiment of the present technology is not limited to the above-described embodiment, and various changes can be made without departing from the scope of the present technology.

Note that effects described in this specification are mere exemplifications, and are not limited, and effects other than those described in this specification may be caused.

Note that the present technology can employ the following configurations.

(1) A light receiving device including:
a plurality of pixels each including
a light receiving element having a light receiving surface, and
a light emission source provided on an opposite side of the light receiving surface with respect to the light receiving element,
in which the plurality of pixels includes
a first pixel including a light shielding member provided between the light receiving element and the light emission source, and
a second pixel including a light guiding unit that is configured to propagate a photon and is provided between the light receiving element and the light emission source.

(2) The light receiving device according to (1) described above,
in which the second pixel further includes a light shielding member configured to cover the light receiving surface of the light receiving element.

(3) The light receiving device according to (1) or (2) described above,
in which the light emission source of the second pixel is caused to emit light at a same timing as an emission timing at which reflected light to be received by the light receiving element of the first pixel is emitted.

(4) The light receiving device according to any one of (1) to (3) described above,
in which two or more substrates including a first substrate and a second substrate are bonded to each other,
the light receiving element is formed on the first substrate, and
the light emission source is formed on the second substrate.

(5) The light receiving device according to (4) described above,
in which a circuit in a pixel region of the second substrate is different between the first pixel and the second pixel.

(6) The light receiving device according to (5) described above,
in which the circuit different between the first pixel and the second pixel is a circuit configured to control the light emission source formed in the second pixel.

(7) The light receiving device according to (4) described above,
in which a circuit in a pixel region of the second substrate is same between the first pixel and the second pixel.

(8) The light receiving device according to any one of (1) to (7) described above,
in which the light receiving element is an SPAD.

(9) The light receiving device according to (8) described above,
in which a signal of the pixel is used for any of distance measurement, correction of distance data, or adequateness check of an applied voltage of the SPAD.

(10) The light receiving device according to (9) described above,
in which, in the adequateness check of an applied voltage of the SPAD, an applied voltage to the SPAD of the second pixel is measured.

(11) The light receiving device according to (10) described above,
in which an anode voltage of the SPAD is controlled on a basis of the measured applied voltage of the SPAD.

(12) The light receiving device according to any one of (1) to (11) described above,
in which a third pixel not used for distance measurement is further included between the first pixel and the second pixel in a planar direction.

(13) The light receiving device according to (12) described above,
in which the third pixel is a non-driven pixel.

(14) The light receiving device according to (12) described above,
in which the third pixel is a pixel driven for monitoring an internal voltage.

(15) The light receiving device according to any one of (1) to (14) described above,
in which the first pixels are arrayed in N1×N2 (N1 and N2 are integers equal to or larger than 1).

(16) The light receiving device according to any one of (1) to (15) described above,
in which the second pixels are arrayed in M1×M2 (M1 and M2 are integers equal to or larger than 1).

(17) The light receiving device according to any one of (1) to (16) described above,
in which the light emission source is formed by any of a transistor, a diode, or a resistor element.

(18) A distance measurement system including:
an illumination device configured to emit illumination light; and
a light receiving device configured to receive reflected light of the illumination light,
in which the light receiving device include
a plurality of pixels each including
a light receiving element having a light receiving surface, and
a light emission source provided on an opposite side of the light receiving surface with respect to the light receiving element, and
the plurality of pixels includes
a first pixel including a light shielding member provided between the light receiving element and the light emission source, and
a second pixel including a light guiding unit that is configured to propagate a photon and is provided between the light receiving element and the light emission source.

REFERENCE SIGNS LIST

11 Distance measurement system
21 Illumination device
22 Imaging device
31 Illumination control unit
32 Light source
41 Imaging unit
42 Control unit
52 Light receiving device
71 Pixel drive unit
72 Pixel array
73 MUX
74 Time measurement unit
75 Signal processing unit
76 Input-output unit
81(81R, 81M, 81D) Pixel
101 SPAD
102 Transistor
103 Switch 104 Inverter
201 First substrate
202 Second substrate
211 Semiconductor substrate
Tr MOS transistor
361 Light guiding unit
362 Light shielding member

The invention claimed is:

1. A light receiving device, comprising:
a plurality of pixels, wherein each of the plurality of pixels includes:
a light receiving element having a light receiving surface; and
a light emission source on a side of the light receiving element opposite to the light receiving surface, wherein the plurality of pixels includes:
a first pixel including a first light shielding member between the light receiving element and the light emission source; and
a second pixel including a light guiding unit, wherein the light guiding unit is configured to propagate a photon and is between the light receiving element and the light emission source.

2. The light receiving device according to claim 1, wherein the second pixel further includes a second light shielding member configured to cover the light receiving surface of the light receiving element.

3. The light receiving device according to claim 1, wherein the light emission source of the second pixel is configured to emit light at a same timing as an emission timing at which reflected light to be received by the light receiving element of the first pixel is emitted.

4. The light receiving device according to claim 1, further comprising at least two substrates including a first substrate and a second substrate, wherein
the first substrate is bonded to the second substrate,
the light receiving element is on the first substrate, and
the light emission source is on the second substrate.

5. The light receiving device according to claim 4, further comprising a circuit in a pixel region of the second substrate.

6. The light receiving device according to claim 5, wherein the circuit is configured to control the light emission source.

7. The light receiving device according to claim 1, wherein the light receiving element is a single photon avalanche diode (SPAD).

8. The light receiving device according to claim 7, wherein for each of the plurality of pixels, each of distance measurement, correction of distance data, or adequateness check of an applied voltage of the SPAD is based on a signal of a respective pixel of the plurality of pixels.

9. The light receiving device according to claim 8, wherein the applied voltage to the SPAD of the second pixel is measured in the adequateness check of the applied voltage of the SPAD.

10. The light receiving device according to claim 9, wherein an anode voltage of the SPAD is based on the applied voltage of the SPAD.

11. The light receiving device according to claim 1, wherein the plurality of pixels further includes a third pixel between the first pixel and the second pixel in a planar direction.

12. The light receiving device according to claim 11, wherein the third pixel is a non-driven pixel.

13. The light receiving device according to claim 11, wherein the third pixel is configured to monitor an internal voltage.

14. The light receiving device according to claim 1, further comprising a plurality of first pixels, wherein
the plurality of first pixels includes the first pixel,
the plurality of first pixels is arrayed in N1×N2, and
N1 and N2 are integers equal to or larger than 1.

15. The light receiving device according to claim 1, further comprising a plurality of second pixels, wherein
the plurality of second pixels includes the second pixel,
the plurality of second pixels is arrayed in M1×M2, and
M1 and M2 are integers equal to or larger than 1.

16. The light receiving device according to claim 1, wherein the light emission source comprises one of a transistor, a diode, or a resistor element.

17. A distance measurement system, comprising:
an illumination device configured to emit illumination light; and
a light receiving device configured to receive reflected light of the illumination light,
wherein the light receiving device includes:
a plurality of pixels, wherein each of the plurality of pixels includes:
a light receiving element having a light receiving surface; and
a light emission source provided on an opposite side of the light receiving surface with respect to the light receiving element, wherein the plurality of pixels includes:
a first pixel including a light shielding member between the light receiving element and the light emission source; and
a second pixel including a light guiding unit, wherein the light guiding unit is configured to propagate a photon and is between the light receiving element and the light emission source.

* * * * *